US008874992B2

(12) United States Patent
Desireddi et al.

(10) Patent No.: US 8,874,992 B2
(45) Date of Patent: Oct. 28, 2014

(54) SYSTEMS AND METHODS TO INITIATE UPDATING OF REFERENCE VOLTAGES

(71) Applicant: Sandisk Technologies Inc., Plano, TX (US)

(72) Inventors: Sateesh Desireddi, Andhra Pradesh (IN); Jayaprakash Naradasi, Bangalore (IN); Anand Venkitachalam, Bangalore (IN); Manuel Antonio D'Abreu, El Dorado Hills, CA (US); Stephen Skala, Fremont, CA (US)

(73) Assignee: Sandisk Technologies Inc., Plano, TX (US)

( * ) Notice: Subject to any disclaimer, the term of this patent is extended or adjusted under 35 U.S.C. 154(b) by 125 days.

(21) Appl. No.: 13/630,686

(22) Filed: Sep. 28, 2012

(65) Prior Publication Data

US 2014/0068382 A1   Mar. 6, 2014

(30) Foreign Application Priority Data

Aug. 31, 2012   (IN) ............................ 3611/CHE/2012

(51) Int. Cl.
  *G11C 29/00*  (2006.01)
  *G11C 11/56*  (2006.01)
  *G11C 16/10*  (2006.01)

(52) U.S. Cl.
  CPC ............ *G11C 11/5642* (2013.01); *G11C 16/10* (2013.01)
  USPC .......................................... 714/763; 714/704

(58) Field of Classification Search
  CPC ....................... G06F 11/1076; G11C 11/5642
  USPC ......... 714/752, 773, 704; 365/185.03, 185.09
  See application file for complete search history.

(56) References Cited

U.S. PATENT DOCUMENTS

| | | | |
|---|---|---|---|
| 6,233,201 B1 | 5/2001 | Sone | |
| 7,135,890 B2 | 11/2006 | Chang | |
| 7,751,237 B2 * | 7/2010 | Alrod et al. | ............... 365/185.02 |
| 7,764,543 B2 * | 7/2010 | Cho et al. | ................. 365/185.03 |
| 7,903,468 B2 | 3/2011 | Litsyn et al. | |
| 7,911,834 B2 | 3/2011 | Cornwell et al. | |
| 7,941,590 B2 | 5/2011 | Yang et al. | |
| 8,027,196 B1 | 9/2011 | Wong | |

(Continued)

OTHER PUBLICATIONS

Desireddi, Sateesh et al.,"Systems and Methods of Updating Read Voltages," U.S. Appl. No. 13/523,680, filed Jun. 14, 2012, 31 pages.

(Continued)

*Primary Examiner* — Esaw Abraham
(74) *Attorney, Agent, or Firm* — Toler Law Group, PC (57) ABSTRACT

In a data storage device that includes a non-volatile memory, a method includes determining that a current error correction code page count (CEC) is at least as large as a target error correction code page count (TEC). The CEC is a page count of error correction code (ECC) pages of data read from the memory during a time period from a previous time to a particular time using a set of reference voltages. In response to the CEC being at least as large as the TEC, the method includes updating a subset of the set of reference voltages conditioned upon a difference between a current mean error count (CMEC) and a previous mean error count being at least as large as a target mean delta error. The CMEC is based on a count of read errors associated with the ECC pages read during the time period.

20 Claims, 5 Drawing Sheets

(56) References Cited

U.S. PATENT DOCUMENTS

| | | |
|---|---|---|
| 8,040,737 B2 | 10/2011 | Alrod et al. |
| 8,095,851 B2 | 1/2012 | Diggs et al. |
| 8,327,229 B2 * | 12/2012 | Noguchi ................ 714/764 |
| 8,503,237 B1 * | 8/2013 | Horn ................ 365/185.09 |
| 8,510,637 B2 * | 8/2013 | Tseng et al. ............. 714/773 |
| 8,578,245 B2 * | 11/2013 | Yeh et al. ............. 714/773 |
| 8,601,313 B1 * | 12/2013 | Horn ................ 714/6.32 |
| 8,638,602 B1 * | 1/2014 | Horn ................ 365/185.03 |
| 2004/0123207 A1 | 6/2004 | Zumkehr et al. |
| 2009/0003058 A1 | 1/2009 | Kang |
| 2009/0154250 A1 | 6/2009 | Lin |
| 2010/0020611 A1 | 1/2010 | Park |
| 2010/0290287 A1 | 11/2010 | Arussi |
| 2010/0332923 A1 | 12/2010 | d'Abreu et al. |
| 2011/0096612 A1 | 4/2011 | Steiner et al. |
| 2011/0182119 A1 | 7/2011 | Strasser et al. |
| 2011/0228604 A1 | 9/2011 | Eli et al. |
| 2012/0079353 A1 | 3/2012 | Liikanen et al. |
| 2012/0284587 A1 | 11/2012 | Yu et al. |
| 2013/0094286 A1 | 4/2013 | Sridharan et al. |

OTHER PUBLICATIONS

Venkitachalam, Anand et al., "Systems and Methods of Updating Read Voltages, " U.S. Appl. No. 13/599,854, filed Aug. 30, 2012, 38 pages.

Notice of Allowance and Fee(s) Due mailed Oct. 22, 2013 in U.S. Appl. No. 13/599,854, 11 pages.

Notice of Allowance and Fee(s) Due mailed May 23, 2014 in U.S. Appl. No. 13/599,854, 5 pages.

Non-Final Office Action mailed Feb. 14, 2014 in U.S. Appl. No. 13/599,854, 7 pages.

\* cited by examiner

SYSTEMS AND METHODS TO INITIATE UPDATING OF REFERENCE VOLTAGES

CLAIM OF PRIORITY

The present application claims priority from Indian Patent Application No. 3611/CHE/2012 filed on Aug. 31, 2012, which is incorporated herein in its entirety.

FIELD OF THE DISCLOSURE

The present disclosure is generally related to updating reference voltages in a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more reference voltages. However, the sensed programming states can sometimes vary from the written programmed states due to one or more factors, such as data retention and program disturb conditions.

SUMMARY

Accuracy of reading data stored in a data storage device may be improved by updating a set of reference voltages to reduce a count of errors associated with reading the stored data. After determining that a target number of error correction code (ECC) pages has been read, updating may be performed conditioned on a mean error count detected exceeding a target mean error count. Mean error count may be based on the errors detected in the ECC pages read during a time period between a previous update of the set of reference voltages and a current time. Updating the set of reference voltages may include, for each reference voltage of a subset of the set of reference voltages, selecting the reference voltage or replacing the reference voltage with an alternate reference voltage, based on a comparison of associated error counts of the reference voltage and the alternate reference voltage.

DETAILED DESCRIPTION

A programmed state of a particular memory element of a data storage device may change over time due to various factors, such as time-related degradation of memory, program disturb factors, and other proximity-related factors. A cell voltage distribution of the data storage device may change over time depending on various parameters including a time elapsed since program, a temperature, a geometry (e.g., die/block/word line), and a number of program and erase cycles, as illustrative examples.

The programmed state of the each data element may be determined by sensing a memory element threshold voltage using one or more reference voltages. The reference voltage corresponding to the memory element threshold voltage may change over time as the threshold voltage of the memory element changes. As a result, use of a fixed reference voltage may result in errors in data values read from memory elements whose threshold voltages have changed over time. In order to maintain reliability and performance of a data storage device, it may be beneficial for a memory controller of the data storage device to update values of reference voltages used to read the data storage device.

Improved error correction capability of data stored in a memory of a data storage device may be achieved with reduced latency by updating reference voltage values based on a comparison of error counts. Systems and methods to determine when to update each reference voltage of the set of reference voltages are disclosed.

Figure 1:
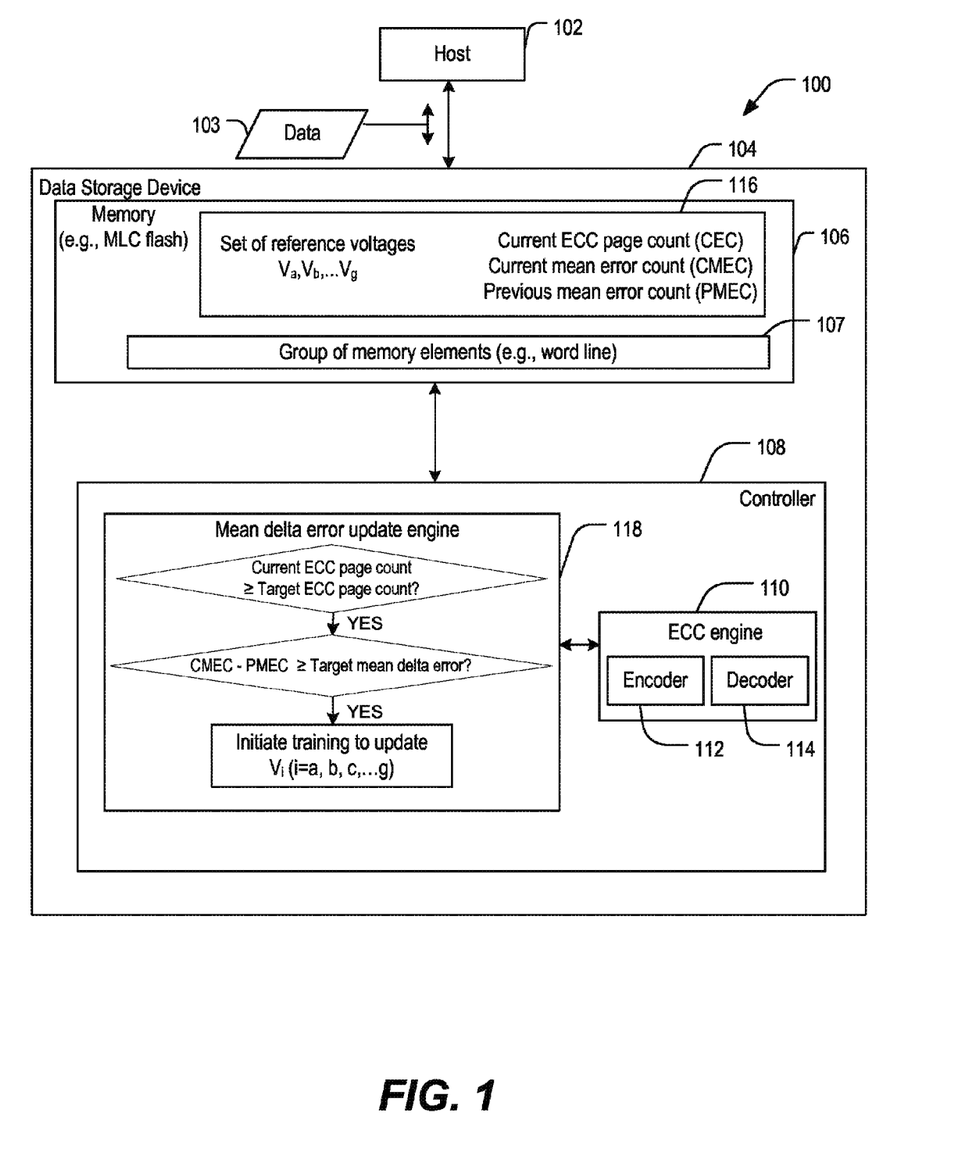
FIG. 1 is a general diagram of a first illustrative embodiment of a system including a data storage device configured to initiate training to update reference voltages conditioned on values of a current ECC page count (CEC) and a difference between a current mean error count (CMEC) and a previous mean error count (PMEC) satisfying corresponding threshold values.

Referring to FIG. 1, a particular illustrative embodiment of a system 100 includes a data storage device 104 that is configured to initiate training to update reference voltages. The data storage device 104 includes a memory 106 coupled to a controller 108. The data storage device 104 is configured to enable exchange of data, such as data 103, between a host device 102 and the memory 106 of the data storage device 104.

The host device 102 may be configured to provide data to be stored at the memory 106 or to request data to be read from the memory 106. For example, the host device 102 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 104 may be a memory card, such as a Secure Digital SD® card, a MicroSD® card, a MiniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 104 may be embedded memory in the host device 102, such as eMMC® (trademark of JEDEC Solid State Technology Association, Arlington, Va.) memory and eSD memory, as illustrative examples.

The memory 106 may be a non-volatile memory of a flash device, such as a NAND flash device, a NOR flash device, or any other type of flash device. The memory 106 may include a group of memory elements 107. For example, the group of memory elements 107 may include a word line. Each memory element in the group of memory elements 107 may be a memory cell of a multi-level cell (MLC) memory.

Figure 3:
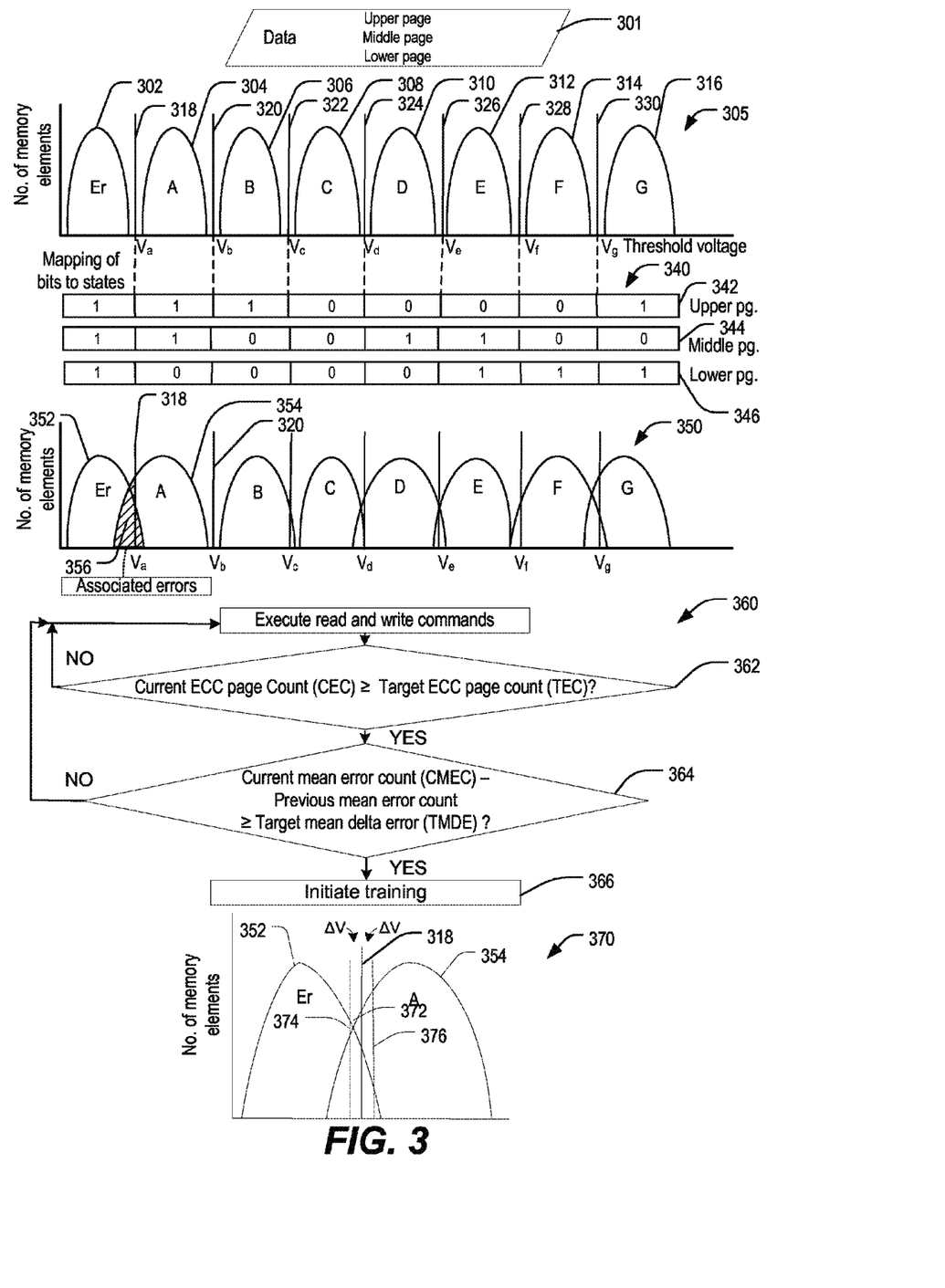
FIG. 3 includes general diagram of an embodiment of a sensing scheme including a graphical depiction of a cell voltage distribution for states (Er, A, . . . G) of a multi-bit storage element of a memory of the data storage device of FIG. 1, a graphical depiction of another cell voltage distribution after program/erase cycles have been executed, a indication of conditions that, upon satisfaction, trigger training (updating) of reference voltages, and an illustration of updating one reference voltage.

Each memory element may have an associated threshold voltage corresponding to a state of the memory element. Each state may correspond to a particular range of threshold voltage values, as depicted in FIG. 3. The state of each memory element represents data stored at the memory element, such as according to a mapping of bits to states of the memory element, as described in FIG. 3. The data stored at the memory element may be read by comparing the threshold voltage of the memory element to one or more reference voltages of a set of reference voltages including reference voltages ($V_a, V_b, \ldots V_g$) that are stored in a portion 116 of the memory 106. The set of reference voltages may be used to sense the state of each of the memory elements of the group of memory elements 107. The portion 116 of the memory 106 may also store other parameters including a current error correction code page count (CEC), a current mean error count (CMEC), and a previous mean error count (PMEC) that are described further with reference to FIGS. 2-5.

The controller 108 may include an error correction code (ECC) engine 110. The ECC engine 110 may include an ECC encoder 112 and an ECC decoder 114. The ECC encoder 112 may be configured to encode data with error correction information. The ECC decoder 114 may be configured to decode the error correction information of data read from the memory 106 and may correct errors in the data, up to an error correction capability of the ECC decoder 114.

The controller 108 may be configured to determine a read point error count (e.g., $E_a$) that is associated with a reference voltage (e.g., $V_a$). The read point error count may be associated with a data read from memory storage elements of the memory 106. The controller 108 may be configured to reset, or update, the reference voltage to an updated reference voltage (e.g., $V_a'$) that has an associated read point error count (e.g., $E_a'$) that is smaller than the read point error count $E_a$.

For example, each reset reference voltage (e.g., $V_a'$) may be associated with an updated read point error count (e.g., $E_a'$) and each reset reference voltage may be selected from multiple candidate reference voltages (e.g., $V_{a\text{-}left}, V_a, V_{a\text{-}right}$) based on a comparison of the associated read point error count of each of the multiple candidate reference voltages. The resetting of the reference voltages may occur iteratively and may be triggered based on satisfaction of a combination of conditions. For example, resetting of the reference voltages may occur conditioned upon a current ECC page count (CEC) (i.e., an incremental page count) exceeding a target ECC page count (TEC), and may be further conditioned upon a differential error count (e.g., an error count associated with the CEC minus a previous error count associated with a previous CEC) exceeding a target mean delta error (TMDE).

The controller 108 includes a mean delta error update engine 118. The mean delta error update engine 118 may be configured to determine the current error correction code page count (CEC) and to determine the current mean error count (CMEC) associated with the CEC. The mean delta error update engine 118 may be configured to determine whether to update a subset of the reference voltages $V_i$ (i=a, b, c, ... g) conditioned upon a comparison of the CEC (i.e., the number of ECC pages read by the ECC engine 110 during a particular time period) to a target ECC page count (TEC), and also conditioned upon a comparison of the TMDE to a difference between the CMEC and the PMEC.

For example, during the time period since a previous updating of reference voltages, the ECC engine 110 may have decoded X pages of data from the memory 106 (e.g., data stored in the group of memory elements 107). The reference voltages $V_i$ (i=a, b, c, ... g) may be updated subject to satisfaction of two conditions. A first condition is that X is greater than the target ECC page count (TEC). A second condition is that a difference between the CMEC (associated with reading the X pages during the time period since the previous updating) and the PMEC (associated with reading ECC pages during a most recent previous time period that is bounded by a first time of a first previous updating of the reference voltages and is bounded by a second time of a second previous updating of the reference voltages) is at least as great as the TMDE. Thus, the mean delta error update engine 118 determines whether the controller 108 is to conduct an update of the reference voltages $V_i$ (i=a, b, c, ... g) based on a differential count of errors detected by the ECC engine 110 since a most recent previous update, and based on a number of pages of data read from the memory 106 since the most recent previous update. By updating the reference voltages $V_a$, $V_b$, etc., the count of read errors (also called read point error count) associated with each reference voltage may be reduced. By limiting the updates based on satisfaction of two conditions, processing by, e.g., the controller 108, to update reference voltages is reduced as compared to processing needed to update the reference voltages on a more frequent basis, e.g., after each program/erase cycle is complete.

During operation, the controller 108 may be configured to determine whether to initiate updating of the reference voltages by using the mean delta error update engine 118. The controller 108 may maintain a count of ECC pages (CEC) read from the memory 106 during a time period that has elapsed since an immediately previous reference voltage update, and the controller 108 may maintain the count of read errors associated with reading the data from the memory 106 during the time period since the immediately previous reference voltage update. The controller 108 may also maintain a total count of read errors since a first reading of the memory 106. The mean delta error update engine 118 may determine whether CEC satisfies a page count threshold, e.g., whether the CEC is at least as large as a target ECC page count (TEC). The controller 108 may also be configured to calculate a current mean error count (CMEC) based on the count of read errors during the current time period (i.e., since the immediately preceding reference voltage update), and based on the CEC. For example, the CMEC may be determined as an average number of errors per ECC page read by the controller 108 and may be calculated by dividing a total count of read errors by a total count of pages read since the start of reading data from the memory 106.

When the CEC satisfies the TEC, the mean delta error update engine 118 may determine whether a difference between the CMEC and a previous mean error count (PMEC) satisfies the target mean delta error (TMDE) threshold. If the TMDE threshold is satisfied, the controller 108 may initiate a reference voltage update of the reference voltages $V_i$ (i=1, b, c, . . . g). Updating the reference voltages may result in lowering one or more of the associated read error counts. For instance, as described with respect to FIG. 3, a particular reference voltage may be updated by comparing a read point error count associated with data read using the particular reference voltage, to a read point error count associated with the data read using an alternate particular reference voltage, and selecting the reset reference voltage corresponding to the smaller associated read point error count. In an embodiment, updating the reference voltages may be accomplished by updating a subset of the reference voltages that does not include all of the reference voltages.

The mean delta error update engine 118 may be implemented using a microprocessor or microcontroller programmed to generate control information and to create an updated set of reference voltages. For example, the mean delta error update engine 118 may read a first set of data using a set of reference voltages (e.g., $V_{i\text{-}center}$) and determine a read point error count (e.g., $E_{i\text{-}center}$) associated with each reference voltage, read a second set of data using first alternative reference voltages (e.g., $V_{i\text{-}left}$) and determine a read point error count (e.g., $E_{i\text{-}left}$) associated with a each of the first alternative reference voltages, and read a third set of data using second alternative reference voltages (e.g., $V_{i\text{-}right}$) and determine a read point error count (e.g., $E_{i\text{-}right}$) associated with each of the second alternative reference voltages. After reading the data, each updated reference voltage may be determined by selecting one of the reference voltage ($V_{i\text{-}center}$), the first alternative reference voltage ($V_{i\text{-}left}$), or the second reference voltage ($V_{i\text{-}right}$) to be included in the updated set of reference voltages based on a comparison of the read point error counts ($E_{i\text{-}center}$, $E_{i\text{-}left}$, $E_{i\text{-}right}$), each read point error count associated with a unique one of the reference voltage ($V_{i\text{-}center}$), the first alternative reference voltage ($V_{i\text{-}left}$), and the second alternative reference voltage ($V_{i\text{-}right}$). In a particular embodiment, the controller 108 includes a processor that executes instructions that are stored at the memory 106. Alternatively, or in addition, instructions that are executable by the processor may be stored at a separate memory location that is not part of the memory 106, such as at a read-only memory (ROM).

In a particular embodiment, the data storage device 104 may be a portable device configured to be selectively coupled to one or more external devices. For example, the data storage device 104 may be a removable device such as a universal serial bus (USB) flash drive or a removable memory card. However, in other embodiments, the data storage device 104 may be attached or embedded within one or more host devices, such as within a housing of a portable communication device. For example, the data storage device 104 may be within a packaged apparatus, such as a wireless telephone, a personal digital assistant (PDA), a gaming device or console, a portable navigation device, a computer, or other device that uses internal non-volatile memory. In a particular embodiment, the data storage device 104 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

An updated set of reference voltages may result in reduced errors associated with read data. Reduced errors may result in a longer useful life of the data storage device 104. Additionally, the reduction in errors due to use of the updated set of reference voltages in reading the stored data may result in reduced processing at the ECC decoder 114, which may result in reduced read latency experienced by the host device 102. By implementing conditions to be satisfied prior to updating of the reference voltages, a frequency of updating may be reduced as compared with updating the reference voltages after each ECC page is read, thus economizing both computing time and processing resources. Implementing updating that is triggered based on a mean count of errors detected since a previous update may result in longer time intervals between updating during an early phase of memory use (i.e., low error rates are encountered) and more frequent updating as the memory ages (i.e., higher error rates are encountered)

Figure 2:
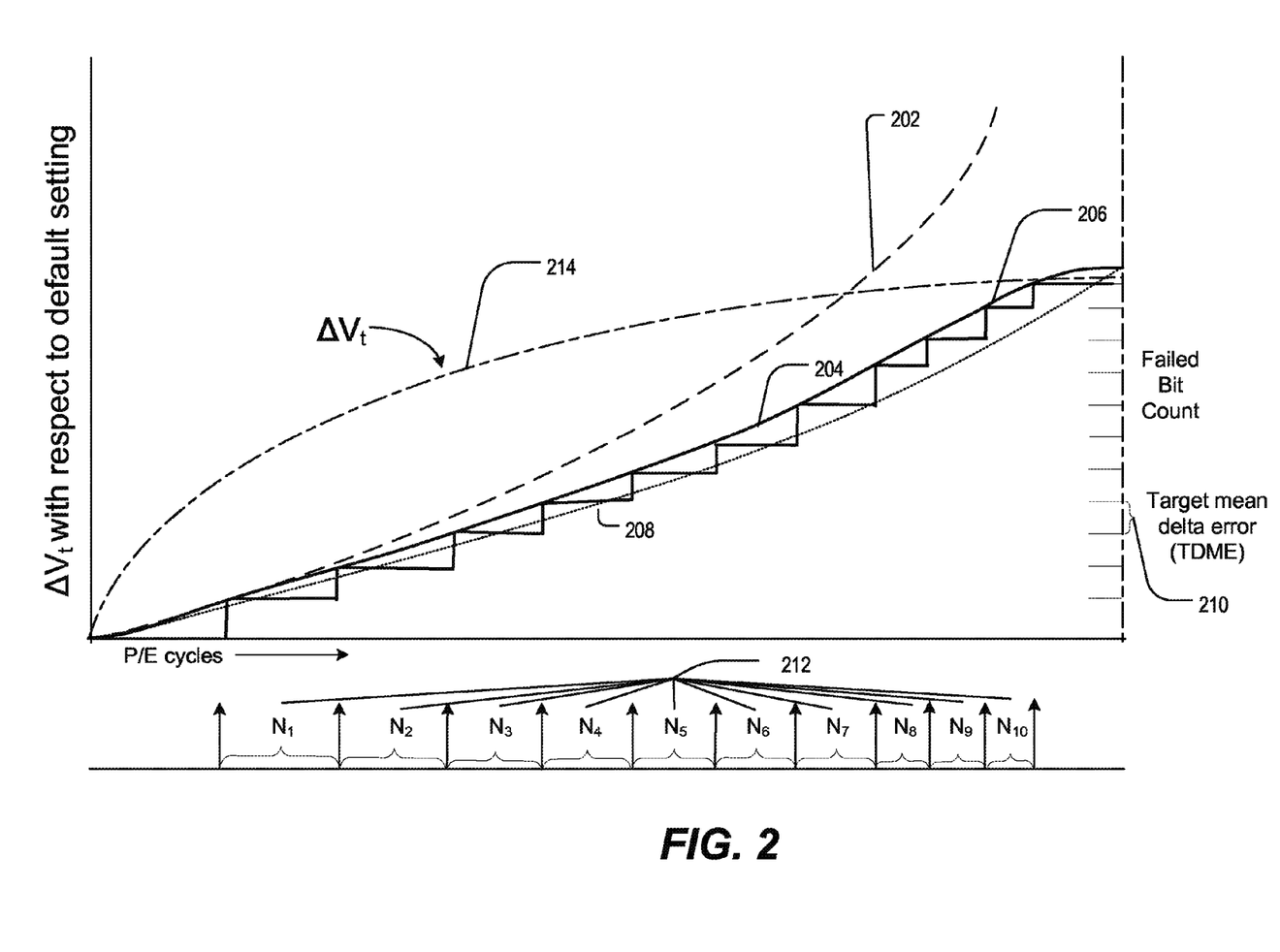
FIG. 2 depicts a graph illustrating updating reference voltages to read memory cells, where the updating is conditioned upon values of the CEC and (CMEC-PMEC) satisfying corresponding threshold values.

FIG. 2 is a graph illustrating failed bit count versus program/erase cycles for a data storage device such as the data storage device 104 of FIG. 1. A first curve 202 illustrates failed bit count of the data storage device versus program/erase cycles when no training (updating) of reference voltages occurs. A second curve 204 illustrates failed bit count of the data storage device versus program/erase cycles when training of reference voltages occurs after each program/erase cycle. By updating reference voltages after each cycle, the failed bit count is less than the failed bit count of the data storage device without training. However, training the reference voltages after each program/erase cycle, as depicted by the second curve 204, is both time-consuming and processing intensive.

A third curve 206 depicts training of reference voltages occurring each time a target mean delta error (TMDE), i.e., incremental failed bit count since the previous training, is reached, e.g., TMDE 210. TMDE 210 may be reached after $N_k$ program/erase cycles (k=1, 2, . . . n), have been completed since occurrence of a previous training ($N_k$ 212 is a set of numbers that are typically greater than 1). A step curve 208 indicates each instance at which an incremental failed bit count equals the TMDE. The number of program/erase cycles ($N_1$, $N_2$, $N_3$, $N_4$ . . . ) between trainings of reference voltages decreases over the life of the data storage device. By training the reference voltages $V_i$ conditioned on the incremental failed bit count being equal to (or exceeding) the TMDE, enhanced performance of the data storage device may be achieved, reflected in lower failed bit count compared with the first curve 202, and without conducting reference voltage training after each program/erase cycle, as in the second curve 204. A fourth curve 214 depicts $\Delta V$ (i.e., change of a reference voltage, i.e., $V_a$, from a default reference voltage) accompanying each training.

FIG. 3 is a diagram of a particular embodiment of a threshold voltage sensing scheme and includes graphical depictions 305 and 350 of cell voltage distributions in a memory including multi-level storage elements. FIG. 3 also shows a method 360 of determining when to initiate training of reference voltages, and a graph 370 illustrating reference voltage training Data 301 may be read by a controller from a group of memory elements of a memory, such as reading by the controller 108 the group of memory elements 107 of the memory 106 within the data storage device 104 of FIG. 1. The read data 301 may be output as an upper page, a middle page, and a lower page. For example, for memory elements that each have capability to store three-bits of data, an initial portion of an output data stream may be the upper page, which is a stream of 1s and 0s that includes an uppermost bit extracted from the three-bit values read from each of the memory elements. That is, for each memory element, only the uppermost bit of the corresponding data value will be included in the upper page. A second portion of the output data stream is a middle page that includes, for each memory element, a middle bit of the three-bit data value of each of the memory elements. A third portion of the output data stream includes a lower page that corresponds to a lowest bit of the three-bit data value of each of the memory elements. Each of the upper, middle, and lower pages may include an ECC code word that is decoded independently of the other pages.

The graph 305 depicts a histogram showing a number of memory elements versus threshold voltage. Each of curves 302, 304, 306, 308, 310, 312, 314, and 316 corresponds to a particular stored data value. For example, the memory elements represented by the curve 302 are programmed with the threshold voltage corresponding to the data value 1 1 1, shown as a "1" value in an upper page 342, a "1" value in a middle page 344, and a "1" value in a lower page 346 of a mapping of bits to states 340. The memory elements represented by the curve 304 are programmed with the threshold voltage corresponding to the data value 1 1 0. The memory elements represented by the curve 306 are programmed with the threshold voltage corresponding to the data value 1 0 0. The memory elements represented by the curve 308 are programmed with the threshold voltage corresponding to the data value 0 0 0. The memory elements represented by the curve 310 are programmed with the threshold voltage corresponding to the data value 0 1 0. The memory elements represented by the curve 312 are programmed with the threshold voltage corresponding to the data value 0 1 1. The memory elements represented by the curve 314 are programmed with the threshold voltage corresponding to the data value 0 0 1. The memory elements represented by the curve 316 are programmed with the threshold voltage corresponding to the data value 1 0 1. The mapping of bits to states 340 shows the stored data value of each of the curves 302-316.

Data stored in each memory element storing a data value may be detected by successively applying reference voltages 318, 320, 322, 324, 326, 328, and 330 to the memory element (e.g., applying the reference voltages to a gate of a NAND flash memory cell), identifying the smallest reference voltage that enables the memory element to be read (e.g., activates the memory element), and identifying the associated state, e.g., as shown in the mapping of bits to states 340. For example, memory elements storing a data value of 1 1 1 may be identified by applying the reference voltage $V_a$ 318 and detecting those memory elements that are activated, represented by the curve 302. Similarly, memory elements storing a data value of 1 1 0 may be identified by increasing the reference voltage applied to a value of $V_b$ 320 and detecting additional memory elements that are activated, represented in the curve 304.

The threshold voltage of a memory element may change due to effects including program disturb and other physical effects. Over the course of numerous program/erase cycles such effects may result in a change in the shape of the histogram curve. For instance, the curve 302 may change shape (i.e., morph) after many program/erase cycles of the memory elements it represents, becoming a curve 352 of a histogram 350. Similarly, the curve 304 may evolve into a curve 354 after the memory elements represented by the curve 304 have experienced program/erase cycles of data storage.

Curve 352 corresponds to storage elements of curve 302 originally programmed to store the data value 111 (i.e., state Er, according to the histogram 305 and the mapping of bits to states 340). Similarly, curve 354 corresponds to storage elements of curve 304 originally programmed to store the data value 110 (i.e., state A). Each of the curves of histogram 350 includes one or more portions that crosses over a reference voltage. For instance, the curve 352 has a portion that lies to the right of the reference voltage $V_a$ 318 and another portion that lies to the left of the reference voltage $V_a$ 318. However, each of the memory elements represented by the curve 302 was originally programmed to store the data value 1 1 1 (i.e., the curve 302 is entirely to the left of the reference voltage $V_a$ 318.) Hence, there will be errors in the read values (read by comparing a storage element's threshold voltage to the reference voltage $V_a$ 318) of the data stored in some of the memory elements represented by the curve 352. Similarly, there will be errors in the read values of the data stored in some of the memory elements represented by the curve 354, because the curve 354 crosses the reference voltage $V_a$ 318. A shaded portion 356 represents read point data errors associated with the reference voltage $V_a$ 318.

The ECC decoder 114 of FIG. 1 may determine a count of errors associated with the upper page of the read data 301. In the mapping 340, there are only two transitional points in the upper page coding. That is, there are only two positions along the upper page of the mapping 340 where the value changes from 1 to 0 or from 0 to 1, corresponding to reference voltages $V_c$ and $V_g$. By receiving the read value of each of the memory elements, it is possible to determine whether the most likely point of transition associated with the error(s) in the upper page reported by the ECC decoder 114 of FIG. 1 is at $V_c$ or $V_g$. Thus, a total error count of the readout of the upper page of the group of memory elements, and the read data value, is sufficient information to select a particular point of transition in the upper page 342 of the mapping 340 associated with each of the errors. For example, a memory element that has an error in its upper page bit and that stores a "0" value in its lower page bit is most likely in state B (i.e., 1 0 0) or state C (i.e., 0 0 0) and the upper page error of the memory element is associated with reference voltage $V_c$. Similarly, a memory element that has an error in its upper page bit and that stores a "1" value in its lower page bit is most likely in state F (i.e., 0 0 1) or state G (i.e., 1 0 1) and the upper page error of the memory element is associated with reference voltage $V_g$. Similarly, a count of errors of the middle page of the read data and the read values of each of the memory elements is sufficient to split the count of errors of the middle page among the reference voltages $V_b$, $V_d$, and $V_f$, and errors in the lower page of the read data are associated with one of $V_a$, and $V_e$ as may be determined through analysis of the read data values. Thus, the controller 108 is operative to determine a count of page errors associated with each of multiple logical pages (e.g., ECC pages that may include upper page, middle page, lower page) and to split each count of page errors associated with a corresponding logical page (e.g., ECC page) into a plurality of read point error counts (i.e., each read point error count is associated with a corresponding reference voltage). Each read point error count may correspond to a particular logical page of the multiple logical pages and each read point error may be determined based on page data associated with one or more other logical pages of the multiple logical pages. Thus, by analyzing the read data 301 and the total error count for each of the upper page, middle page, and lower page of the read data 301, a read point error count may be associated with each reference voltage ($V_a, \ldots, V_g$).

The method 360 includes a series of conditions to determine whether to update ("train") one or more reference voltages. In response to the current ECC page count (CEC) of read data being greater than or equal to the target ECC page count (TEC), at 362, and conditioned upon the current mean error count (CMEC) minus the previous mean error count (PMEC) being greater than or equal to a target mean delta error (TMDE), at 364, training of reference voltages is initiated, at 366.

Graph 370 depicts an example of training of the reference voltage $V_a$ 318. A first alternate reference voltage $V_{a\text{-}left}$ 374, and a second alternate reference voltage $V_{a\text{-}right}$ 376 are considered. The first alternate reference voltage $V_{a\text{-}left}$ 374 has been calculated by subtracting a voltage increment $\Delta V$ from the reference voltage $V_a$ 318. The second alternate reference voltage $V_{a\text{-}right}$ 376 has been calculated by adding the voltage increment $\Delta V$ to the reference voltage $V_a$ 318. However, in other embodiments, the first alternate reference voltage 374 may be calculated by subtracting, from the reference voltage $V_a$ 318, another voltage increment that is different than the voltage increment $\Delta V$ added to the reference voltage $V_a$ 318 to determine the second alternate reference voltage $V_{a\text{-}right}$ 376. In a particular example, $\Delta V$ may be at least as large as a lower threshold voltage increment and $\Delta V$ may be not larger than an upper threshold voltage increment. For example, the lower threshold voltage increment may be associated with a smallest voltage increment that can be applied by the controller 108 of FIG. 1. In another example, the upper threshold voltage increment may be less than a difference between the reference voltage $V_a$ 318 and the reference voltage $V_b$ 320.

The first alternate reference voltage $V_{a\text{-}left}$ 374, when used to read data stored in the memory elements, typically results in an associated error count that differs from the error count associated with the reference voltage $V_a$ 318. The first alternate reference voltage $V_{a\text{-}left}$ 374 is closer than the reference voltage $V_a$ 318 to an intersection 372 of curves 352 and 354, and a first alternate error count associated with the first alternate reference voltage $V_{a\text{-}left}$ 374 is expected to be smaller than the error count associated with the reference voltage $V_a$ 318. The second alternate reference voltage $V_{a\text{-}right}$ 376 is further than the reference voltage $V_a$ 318 from the intersection 372, and a second alternate error count associated with the second alternate reference voltage $V_{a\text{-}right}$ 318 is expected to be larger than the error count associated with the reference voltage $V_a$ 318.

An updated reference voltage may be selected based on a comparison of the error counts associated with each of the reference voltage $V_a$ 318, the first alternate reference voltage $V_{a\text{-}left}$ 374, and the second alternate reference voltage $V_{a\text{-}right}$ 376. For example, the updated reference voltage may be selected to be the first alternate reference voltage $V_{a\text{-}left}$ 374 based on the comparison of the error counts associated with each of $V_{a\text{-}left}$ 374, $V_a$ 318, and $V_{a\text{-}right}$ 376. The reference voltage $V_a$ 318 may be reset to the updated reference voltage $V_{a\text{-}left}$ 374. After updating, the error count associated with the updated reference voltage is smaller than the error count associated with $V_a$ 318.

Multiple iterations of the training may be carried out, fine-tuning the updated reference voltage $V_a$ to reduce read point errors associated with the reference voltage $V_a$. A smallest voltage increment may be selected or may result from an implementation-specific characteristic, and therefore a finite number of iterations may be performed to fine-tune the selection of the updated reference voltage to a resolution corresponding to the smallest voltage increment.

Reference voltage updating may be carried out for a subset of the reference voltages ($V_a, V_b, V_c, \ldots V_g$) 318-330 of FIG. 3. In an example, the subset of the reference voltages may include all of the reference voltages ($V_a, V_b, V_c, \ldots V_g$) 318-330. The resulting set of updated reference voltages may result in a reduced error count associated with reading the data stored in the memory elements. By limiting updates based on satisfaction of the conditions at 362 and 364 of the method 360, computing time and processing power devoted to updating of reference voltages may be reduced as compared with updating after each program/erase cycle.

As depicted in FIG. 3 for a 3-bit per cell (BPC) MLC memory, the set of reference voltages 116 may include seven reference voltages. For example, the seven reference voltages may be $V_i$ (i=a, ... g), as in graphs 305 and 350. Each memory element of the group of memory elements 107 of FIG. 1 may store three bits, as shown in the mapping 340 of FIG. 3. However, in other embodiments, there may be 2 bits per cell (3 reference voltages), 4 bits per cell (15 reference voltages), or a different number of bits per cell.

Figure 4:
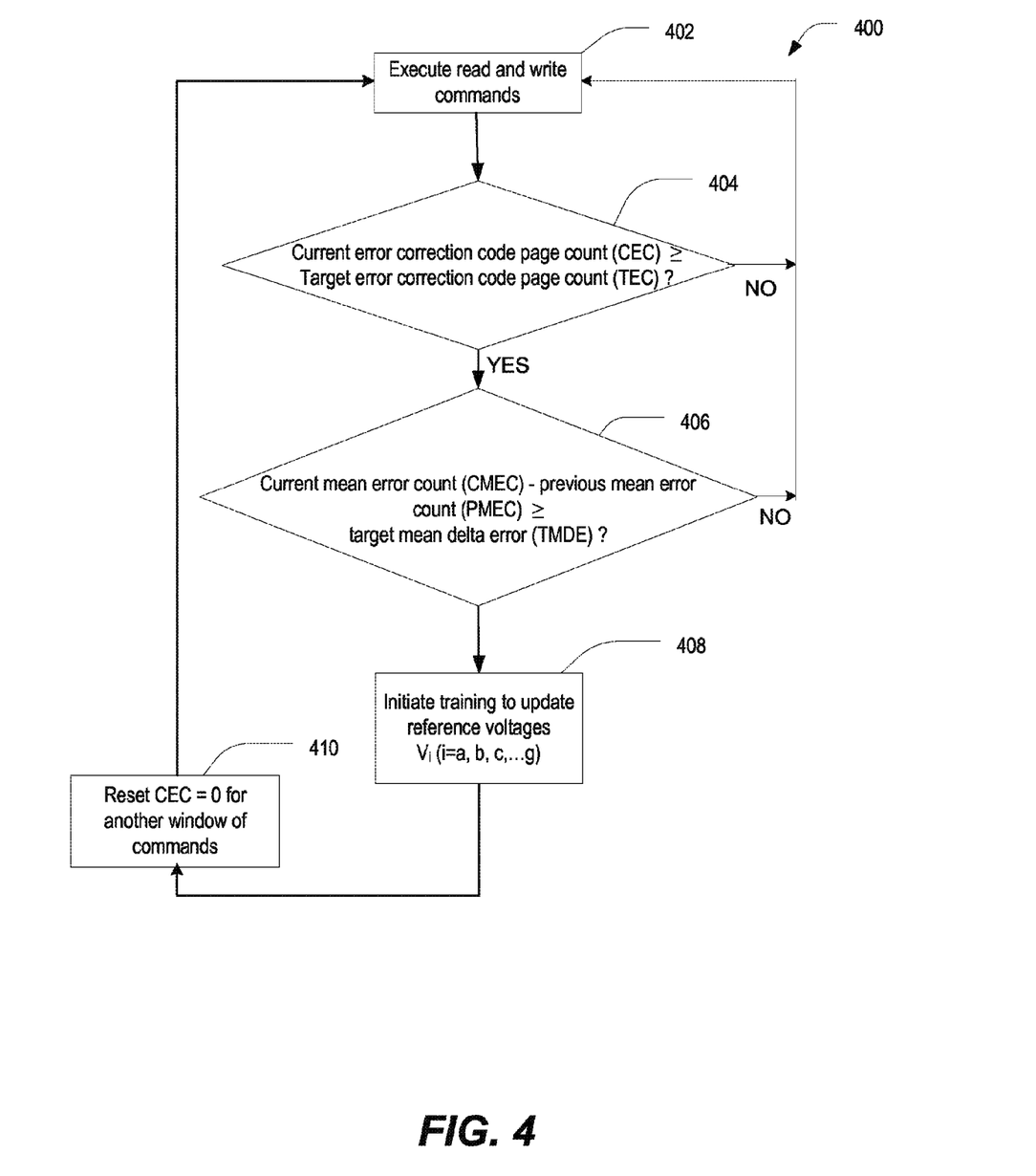
FIG. 4 is a flow diagram illustrating a particular embodiment of a method of updating reference voltages based on a comparison of read error counts associated with the reference voltages, where the updating is conditioned upon values of the CEC and (CMEC-PMEC) satisfying corresponding threshold values.

FIG. 4 is a flow diagram illustrating a particular embodiment of a method 400 of updating a subset of a set of reference voltages based on a comparison of error counts. Read and write commands directed to a memory are executed, at 402. For example, the read and write commands may be directed to the non-volatile memory 106 of FIG. 1. Read commands may include reading stored data from a group of memory elements using a set of reference voltages, such as the reference voltages ($V_a, V_c, \ldots V_g$) 318-330 of FIG. 3. The group of memory elements that are read may be the group of memory elements 107 in the non-volatile memory 106 of FIG. 1, such as a flash memory.

A determination is made as to whether a current ECC page count (CEC) (i.e., a count of pages read in a current time period since a most recent reference voltage update) is at least as large as a target ECC page count (TEC), at 404. If the CEC is not as large as the TEC, the method returns to 402. If the CEC is at least as large as the TEC, a determination is made as to whether a current mean error count (CMEC) (i.e., a mean of error counts for the current time period, during which the CEC is at least as large as the TEC) is at least as large as a target mean delta error (TMDE), which may be a target number of errors that are detected in the current time period, at 406. If the CMEC is less than the TMDE, the method returns to 402. If the CMEC is at least as large as the TMDE, training is initiated to update reference voltages or a subset of the reference voltages is performed, at 408. Updating may include training each reference voltage of the subset of the reference voltages. For example, the training described with reference to the graph 370 of FIG. 3 may be used to update one or more of the reference voltages. In an example, the subset of the reference voltages may include only one reference voltage, such as the reference voltage $V_a$ 318 of FIG. 3. In another example, the subset of reference voltages may include a portion of the reference voltages 318-330 (i.e., $V_a, V_b, V_c, V_d, V_e, V_f, V_g$) of FIG. 3. After updating the subset of the reference voltages, the CEC is reset to zero, at 410, and the method returns to 402.

By updating the subset of the reference voltages a total number of errors associated with reading data stored in memory may be reduced when reading data using the updated set of reference voltages. Triggering the updating conditioned upon a number of ECC pages read (CEC) since a previous update being at least as large as a target ECC page count (TEC) and conditioned upon a current mean error count (CMEC) being at least as large as a target mean delta error (TMDE) results in more efficient use of computing resources than updating reference voltages after each ECC page is read or after each count of read errors. Selection of each updated reference voltage may be selected based upon, e.g., a comparison of error counts of two or more potential updated reference voltages.

Updating the set of reference voltages, either periodically or aperiodically during the life of the memory, can be advantageous in that the updating may compensate for increases in error counts due to changes in the threshold voltages of some of the memory elements "on the fly." Reducing errors in data read from memory may extend the useful life of the memory and may result in reduced read latency.

Figure 5:
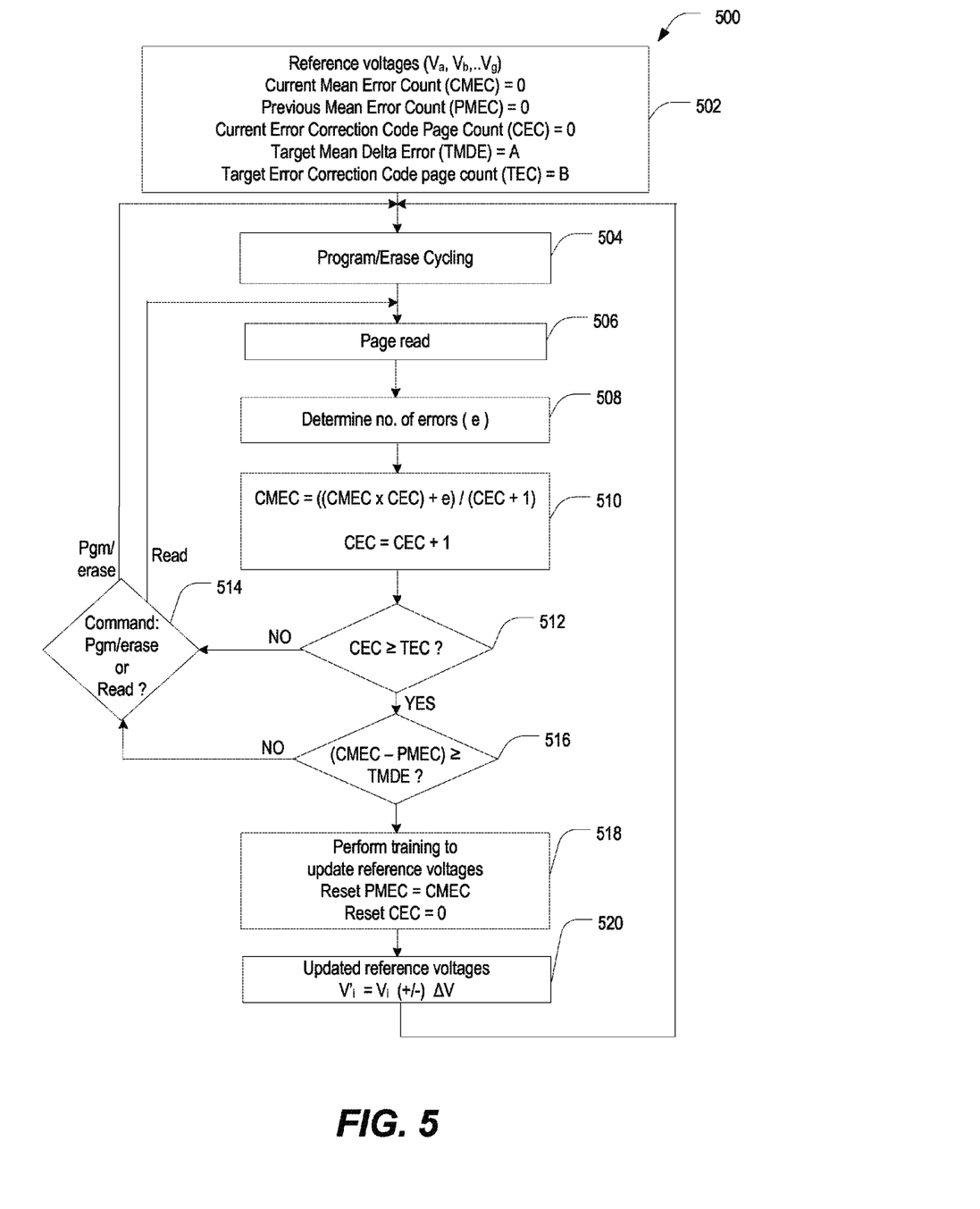
FIG. 5 is a flow diagram illustrating another particular embodiment of a method of updating reference voltages, where the updating is conditioned upon values of the CEC and (CMEC-PMEC) satisfying corresponding threshold values.

FIG. 5 is a flow diagram illustrating another particular embodiment of a method of updating one or more reference voltages based on a comparison of error counts, and is generally designated 500. Reference voltages are established at values ($V_a, V_b, V_c, V_d, V_e, V_f, V_g$), a current mean error count (CMEC) is set to zero, a previous mean error count (PMEC) is set to zero, a current ECC page count (CEC) is set to zero, a target mean delta error (TDMA) is set to a value A, and a target ECC page count (TEC) is set to a value B, at 502. Program/erase cycling is begun, at 504. An ECC page of data is read, at 506. A number of errors "e" associated with the ECC page that has been read is determined, at 508. A current mean error count (CMEC) is determined and the current ECC page count (CEC) is increased by one, at 510. A determination is made as to whether the CEC is at least as large as the TEC, at 512. If the CEC is not as large at the TEC, a determination of whether the next command is a program/erase command or a read command, at 514. If the command is a program/erase command, the method returns to 504. If the command is a read command, the method returns to 506.

If the CEC is at least as large as the TEC, at 512, a determination is made as to whether a difference between the CMEC and the previous mean ECC error count (PMEC) is at least as large as the target mean delta error (TMDE), at 516. If the difference between the CMEC and the PMEC is not as large as the TMDE, a next command is determined, at 514. The method returns to 504 if the command is a program/erase or to 506 if the command is a read command. If the difference between the CMEC and the PMEC is at least as large as the TMDE, training is performed to update one or more of the reference voltages, the PMEC is set equal to the CMEC, and the CEC is reset to zero, at 518. Updated reference voltages are adopted within the set of reference voltages, at 520, and the method returns to 504.

In an example, after updating the reference voltages, the set of updated reference voltages may be stored in the memory 106 of FIG. 1 and may replace a previously stored set of reference voltages 116. The set of updated reference voltages stored in the controller 108 may be used to read the data values stored in the memory 106 of FIG. 1. For instance, the set of updated reference voltages may be sent from the controller 108 to the memory 106 and may be stored in the memory 106, where the set of updated reference voltages is available for reading the stored data values in the group of memory elements 107.

The method 500 may be used to reduce error counts of read data. By selecting each updated reference voltage based on a comparison of associated error counts, a total number of errors associated with reading data stored in memory may be reduced. An additional advantage of reducing the error count may be a reduction in the load of the ECC decoder, which may result in faster data reads. By updating one or more reference voltages conditioned on a count of ECC pages read being at least as large as a target number of ECC pages and further conditioned on a mean error count being at least as large as a target mean error count, a frequency of updating the reference voltages may be reduced compared with updating after each program/erase cycle, or after each page read. Reducing the frequency of updating reduces associated processor burden due to determination of error counts associated with each potential updated reference voltage under consideration during updating.

By selecting each updated reference voltage based on a comparison of associated error counts, a total number of errors associated with reading data stored in memory may be reduced. Using an iterative technique to fine-tune each reference voltage may further reduce the total number of errors associated with reading the stored data, each iteration resulting in corresponding total error count that is less than the total error count associated with the previous iteration.

Although various components depicted herein are illustrated as block components and described in general terms, such components may include one or more microprocessors, state machines, or other circuits configured to enable a data storage device, such as the data storage device 104 of FIG. 1, to perform the particular functions attributed to such components. For example, the mean delta error update engine 118 of FIG. 1 may represent physical components, such as controllers, processors, state machines, logic circuits, or other structures to create an updated set of reference voltages.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a non-volatile memory, performing:
   determining that a current error correction code page count (CEC) value is equal to or larger than a target error correction code page count (TEC) value by comparing the CEC value to the TEC value, wherein the CEC value is a count of error correction code (ECC) pages of data read from the non-volatile memory during a time period from a previous time to a particular time, wherein the data is read using a set of reference voltages; and
   in response to the CEC value being equal to or larger than the TEC value, updating a subset of the set of reference voltages conditioned upon a difference between a current mean error count (CMEC) and a previous mean error count (PMEC) being at least as large as a target mean delta error (TMDE), wherein the CMEC is based on a count of read errors associated with the data read from the non-volatile memory during the time period.

2. The method of claim 1, wherein the subset of the set of reference voltages includes each reference voltage of the set of reference voltages.

3. The method of claim 1, wherein the previous time is associated with a previous update of a first reference voltage of the set of reference voltages.

4. The method of claim 1, wherein each ECC page is decoded at an error correction code (ECC) decoder.

5. The method of claim 4, wherein the CMEC is a mean error count of errors per ECC page for the ECC pages of data read during the time period.

6. The method of claim 1, wherein each memory element stores a plurality of bits.

7. The method of claim 1, wherein the non-volatile memory is a flash memory.

8. The method of claim 1, wherein updating the subset includes, for a first reference voltage of the set of reference voltages:
determining an alternate first reference voltage;
determining an error count associated with the first reference voltage and determine an alternate error count associated with the alternate first reference voltage; and
selecting an updated first reference voltage as one of the first reference voltage and the alternate first reference voltage based upon a comparison of the error count to the alternate error count.

9. The method of claim 8, wherein the error count is determined from data values that are read using the first reference voltage, and the alternate error count is determined from alternate data values that are read using the alternate first reference voltage.

10. The method of claim 8, wherein the alternate first reference voltage is set to a value such that a difference between the first reference voltage and the alternate first reference voltage is at least as large as a lower threshold and is not larger than an upper threshold.

11. A data storage device comprising:
a non-volatile memory; and
a controller, the controller configured to:
determine that a current error correction code page count (CEC) value is equal to or larger than a target error correction code page count (TEC) value by comparing the CEC value to the TEC value, wherein the CEC value is associated with reading data that is stored in the non-volatile memory;
determine whether a difference between a current mean error count (CMEC) and a previous mean error count (PMEC) is at least as large as a target mean delta error (TMDE), wherein the CMEC is based on read errors associated with reading the data stored in the non-volatile memory using reference voltages; and
update reference voltages conditioned upon the CEC being at least as large as the TEC and conditioned upon the difference between the CMEC and the PMEC being at least as large as the TMDE.

12. The data storage device of claim 11, further comprising an error correction code (ECC) decoder, the ECC decoder configured to identify errors associated reading the data.

13. The data storage device of claim 12, wherein the data is read as multiple ECC pages.

14. The data storage device of claim 13, wherein each ECC page is decoded at the ECC decoder.

15. The data storage device of claim 13, wherein the controller is further configured to:
determine a count of page errors associated with each page of the ECC pages; and
split each count of page errors into a corresponding plurality of read point error counts, wherein each read point error count corresponds to a particular ECC page of the ECC pages and each of the read point error counts is determined based on page data associated with one or more other ECC pages of the ECC pages, and wherein each of the read point error counts is associated with a corresponding reference voltage of the reference voltages.

16. The data storage device of claim 11, wherein the controller is further configured to determine a first read point error count, wherein the first read point error count is determined based on reading the data using a first reference voltage of the reference voltages.

17. The data storage device of claim 11, wherein a first reference voltage is updated by selecting an updated first reference voltage as one of the first reference voltage, a first alternate reference voltage that is determined by subtracting a voltage increment from the first reference voltage, and a second alternate reference voltage that is determined by adding the voltage increment to the first reference voltage, wherein the selection is based on a corresponding read point error count of each of the first reference voltage, the first alternate reference voltage, and the second alternate reference voltage.

18. The data storage device of claim 17, wherein the voltage increment is less than an upper threshold voltage increment, wherein the upper threshold voltage increment is less than a difference between the first reference voltage and an adjacent reference voltage.

19. The data storage device of claim 11, wherein the non-volatile memory is a flash memory.

20. The data storage device of claim 11, wherein the non-volatile memory comprises memory elements, wherein each memory element stores a plurality of bits.

* * * * *